(12) United States Patent
Yu

(10) Patent No.: US 11,309,337 B2
(45) Date of Patent: Apr. 19, 2022

(54) METHOD OF MANUFACTURING ARRAY SUBSTRATE AND ARRAY SUBSTRATE

(71) Applicant: WUHAN CHINA STAR OPTOELECTRONICS TECHNOLOGY CO., LTD., Hubei (CN)

(72) Inventor: Pengfei Yu, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 229 days.

(21) Appl. No.: 16/632,466

(22) PCT Filed: Nov. 11, 2019

(86) PCT No.: PCT/CN2019/116972
§ 371 (c)(1),
(2) Date: Jan. 20, 2020

(87) PCT Pub. No.: WO2021/031393
PCT Pub. Date: Feb. 25, 2021

(65) Prior Publication Data
US 2021/0408051 A1 Dec. 30, 2021

(30) Foreign Application Priority Data
Aug. 22, 2019 (CN) .......................... 201910776574.0

(51) Int. Cl.
*H01L 27/12* (2006.01)

(52) U.S. Cl.
CPC ........ *H01L 27/124* (2013.01); *H01L 27/1248* (2013.01); *H01L 27/1259* (2013.01)

(58) Field of Classification Search
None
See application file for complete search history.

(56) References Cited

U.S. PATENT DOCUMENTS

| | | | |
|---|---|---|---|
| 10,496,202 B2 | 12/2019 | Zhan et al. | |
| 2013/0162570 A1* | 6/2013 | Shin | G06F 3/0412 345/173 |
| 2017/0038887 A1* | 2/2017 | Zhang | G02F 1/136227 |
| 2017/0092658 A1* | 3/2017 | Sun | H01L 29/78621 |
| 2020/0185416 A1 | 6/2020 | Wu et al. | |

FOREIGN PATENT DOCUMENTS

| | | |
|---|---|---|
| CN | 106168865 A | 11/2016 |
| CN | 107170764 A | 9/2017 |
| CN | 108110010 A | 6/2018 |
| CN | 108319397 A | 7/2018 |

* cited by examiner

*Primary Examiner* — Bo B Jang

(57) ABSTRACT

A method of manufacturing an array substrate and an array substrate are provided. The method includes steps of providing a first metallic layer, a semiconductor layer, a second metallic layer, a common electrode layer, a protecting layer, and a pixel electrode layer on a substrate in sequence. The semiconductor layer is electrically connected to a source electrode of the first metallic layer through a first via hole. Part of the semiconductor layer is electrically connected to a drain electrode of the second metallic layer. A touch electrode is electrically connected to a touch signal line through a second via hole. The pixel electrode layer is electrically connected to the drain electrode through a third via hole.

13 Claims, 2 Drawing Sheets

METHOD OF MANUFACTURING ARRAY SUBSTRATE AND ARRAY SUBSTRATE

FIELD

The present disclosure relates to display technologies, and more particularly, to a method of manufacturing an array substrate and an array substrate.

BACKGROUND

With development of integrated touch display panels, people are increasingly demanding high resolution. Therefore, a fine active driving matrix (array substrate) is required to perform liquid crystal deflection in each pixel region. However, steps of a method for preparing an integrated touch array substrate in the prior art are cumbersome, resulting in high production cost and long cycle.

SUMMARY

In view of the above, the present disclosure provides a method of manufacturing an array substrate and an array substrate to solve the technical issue that steps of a method for preparing an integrated touch array substrate in the prior art are cumbersome, resulting in high production cost and long cycle.

In order to achieve above-mentioned object of the present disclosure, one embodiment of the disclosure provides a method of manufacturing an array substrate, including:

providing a substrate;

providing a patterned first metallic layer on the substrate, wherein the first metallic layer includes a source electrode;

providing a first insulating layer on the patterned first metallic layer;

providing a patterned semiconductor layer on the first insulating layer, wherein a part of the semiconductor layer corresponding to the source electrode is electrically connected to the source electrode;

providing a second insulating layer on the patterned semiconductor layer;

providing a patterned second metallic layer on the second insulating layer, wherein the second metallic layer includes a touch signal line, a gate electrode, and a drain electrode, and the drain electrode is electrically connected to a part of the semiconductor layer corresponding to the drain electrode;

providing a planarization layer on the patterned second metallic layer;

providing a patterned common electrode layer on the planarization layer, wherein the patterned common electrode layer includes a touch electrode electrically connected to the touch signal line;

providing a protecting layer on the patterned common electrode layer; and providing a patterned pixel electrode layer on the protecting layer, wherein the patterned pixel electrode layer includes a pixel electrode electrically connected to the drain electrode;

wherein the first metallic layer includes a data line and a shading layer, and the data line is connected to the source electrode and integrated with the source electrode;

wherein the data line, the source electrode, and the shading layer are formed with a same mask;

wherein the second metallic layer further includes a gate line connected to the gate electrode and integrated with the gate electrode, and an extension direction of the gate line is parallel to an extension direction of the touch signal line; and wherein the touch signal line, the gate electrode, the gate line, and the drain electrode are formed with a same mask.

In one embodiment of the method of manufacturing an array substrate of the disclosure, the step of providing the second insulating layer on the patterned semiconductor layer, includes steps of:

providing the second insulating layer on the patterned semiconductor layer; and patterning the second insulating layer to form an opening exposing the part of the semiconductor layer corresponding to the drain electrode.

In one embodiment of the method of manufacturing an array substrate of the disclosure, the drain electrode is disposed in the opening and electrically connected to the semiconductor layer.

In one embodiment of the method of manufacturing an array substrate of the disclosure, the step of providing the first insulating layer on the patterned first metallic layer, includes steps of:

providing the first insulating layer on the patterned first metallic layer; and patterning the first insulating layer to form a first via hole exposing the source electrode.

In one embodiment of the method of manufacturing an array substrate of the disclosure, the part of the semiconductor layer corresponding to the source electrode is electrically connected to the source electrode through the first via hole.

Furthermore, another embodiment of the disclosure provides a method of manufacturing an array substrate, includes steps of:

providing a substrate;

providing a patterned first metallic layer on the substrate, wherein the first metallic layer includes a source electrode;

providing a first insulating layer on the patterned first metallic layer;

providing a patterned semiconductor layer on the first insulating layer, wherein a part of the semiconductor layer corresponding to the source electrode is electrically connected to the source electrode;

providing a second insulating layer on the patterned semiconductor layer;

providing a patterned second metallic layer on the second insulating layer, wherein the second metallic layer includes a touch signal line, a gate electrode, and a drain electrode, and the drain electrode is electrically connected to a part of the semiconductor layer corresponding to the drain electrode;

providing a planarization layer on the patterned second metallic layer;

providing a patterned common electrode layer on the planarization layer, wherein the patterned common electrode layer includes a touch electrode electrically connected to the touch signal line;

providing a protecting layer on the patterned common electrode layer; and providing a patterned pixel electrode layer on the protecting layer, wherein the patterned pixel electrode layer includes a pixel electrode electrically connected to the drain electrode.

In one embodiment of the method of manufacturing an array substrate of the disclosure, the first metallic layer includes a data line and a shading layer, and the data line is connected to the source electrode and integrated with the source electrode; and the data line, the source electrode, and the shading layer are formed with a same mask.

In one embodiment of the method of manufacturing an array substrate of the disclosure, the second metallic layer further includes a gate line connected to the gate electrode and integrated with the gate electrode, and an extension direction of the gate line is parallel to an extension direction of the touch signal line; and the touch signal line, the gate electrode, the gate line, and the drain electrode are formed with a same mask.

In one embodiment of the method of manufacturing an array substrate of the disclosure, the step of providing the first insulating layer on the patterned first metallic layer, includes steps of:

providing the first insulating layer on the patterned first metallic layer; and patterning the first insulating layer to form a first via hole exposing the source electrode.

In one embodiment of the method of manufacturing an array substrate of the disclosure, the part of the semiconductor layer corresponding to the source electrode is electrically connected to the source electrode through the first via hole.

In one embodiment of the method of manufacturing an array substrate of the disclosure, the step of providing the second insulating layer on the patterned semiconductor layer, includes steps of:

providing the second insulating layer on the patterned semiconductor layer; and patterning the second insulating layer to form an opening exposing the part of the semiconductor layer corresponding to the drain electrode.

In one embodiment of the method of manufacturing an array substrate of the disclosure, the drain electrode is disposed in the opening and electrically connected to the semiconductor layer.

In one embodiment of the method of manufacturing an array substrate of the disclosure, the step of providing the planarization layer on the patterned second metallic layer, includes steps of:

providing the planarization layer on the patterned second metallic layer; and patterning the planarization layer to form a second via hole exposing the touch signal line.

In one embodiment of the method of manufacturing an array substrate of the disclosure, the touch electrode is electrically connected to the touch signal line through the second via hole.

In one embodiment of the method of manufacturing an array substrate of the disclosure, the step of providing the protecting layer on the patterned common electrode layer, includes steps of:

providing the protecting layer on the patterned common electrode layer; and patterning the protecting layer to from a third via hole corresponding to the drain electrode, extending to the planarization layer, and exposing the drain electrode.

In one embodiment of the method of manufacturing an array substrate of the disclosure, the pixel electrode is electrically connected to the drain electrode through the third via hole.

Furthermore, another embodiment of the disclosure provides an array substrate, includes:

a substrate;

a patterned first metallic layer disposed on the substrate, wherein the first metallic layer includes a source electrode;

a first insulating layer covering the first metallic layer, wherein the first insulating layer is provided with a first via hole corresponding to the source electrode;

a semiconductor layer disposed on the first insulating layer, wherein a part of the semiconductor layer corresponding to the source electrode is electrically connected to the source electrode through the first via hole;

a second insulating layer covering the semiconductor layer, wherein the second insulating layer is provided with an opening exposing a part of the semiconductor layer corresponding to a drain electrode;

a second metallic layer disposed on the second insulating layer, wherein the second metallic layer includes a touch signal line, a gate electrode, and the drain electrode, and the drain electrode is disposed in the opening and is electrically connected to the semiconductor layer;

a planarization layer covering the second metallic layer, the planarization layer is provided with a second via hole exposing the touch signal line;

a common electrode layer disposed on the planarization layer, wherein the common electrode layer includes a touch electrode electrically connected to the touch signal line through the second via hole;

a protecting layer covering the common electrode layer, wherein the protecting layer is provided with a third via hole corresponding to the drain electrode, extending to the planarization layer, and exposing the drain electrode; and a pixel electrode layer disposed on the protecting layer, wherein the pixel electrode layer includes a pixel electrode electrically connected to the drain electrode through the third via hole.

In one embodiment of the array substrate of the disclosure, the first metallic layer includes a data line and a shading layer, the data line is connected to the source electrode and integrated with the source electrode, and the shading layer is disposed under a channel of the semiconductor layer.

In one embodiment of the array substrate of the disclosure, the second metallic layer further includes a gate line connected to the gate electrode and integrated with the gate electrode, and an extension direction of touch signal line is parallel to an extension direction of the gate line.

In comparison with prior art, the method of manufacturing an array substrate of the disclosure provides the source electrode of the first metallic layer under the semiconductor layer, provides the gate electrode, the drain electrode, and the touch signal line of the second metallic layer above the semiconductor layer, and forms a new transistor structure by electrically connected the source electrode, the drain electrode and the semiconductor layer to provide a new process. The disclosure provides the gate electrode, the drain electrode, and the touch signal line on the same layer and formed with the same mask to reduce technical processes to solve the technical issue that steps of a method for preparing an integrated touch array substrate in the prior art are cumbersome, resulting in high production cost and long cycle.

BRIEF DESCRIPTION OF DRAWINGS

In order to more clearly illustrate the embodiments of the present application or the technical solutions in the prior art, the drawings used in the embodiments will be briefly described below. The drawings in the following description are only partial embodiments of the present application, and those skilled in the art can obtain other drawings according to the drawings without any creative work.

DETAILED DESCRIPTION

The following description of the embodiments is provided by reference to the drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 1:
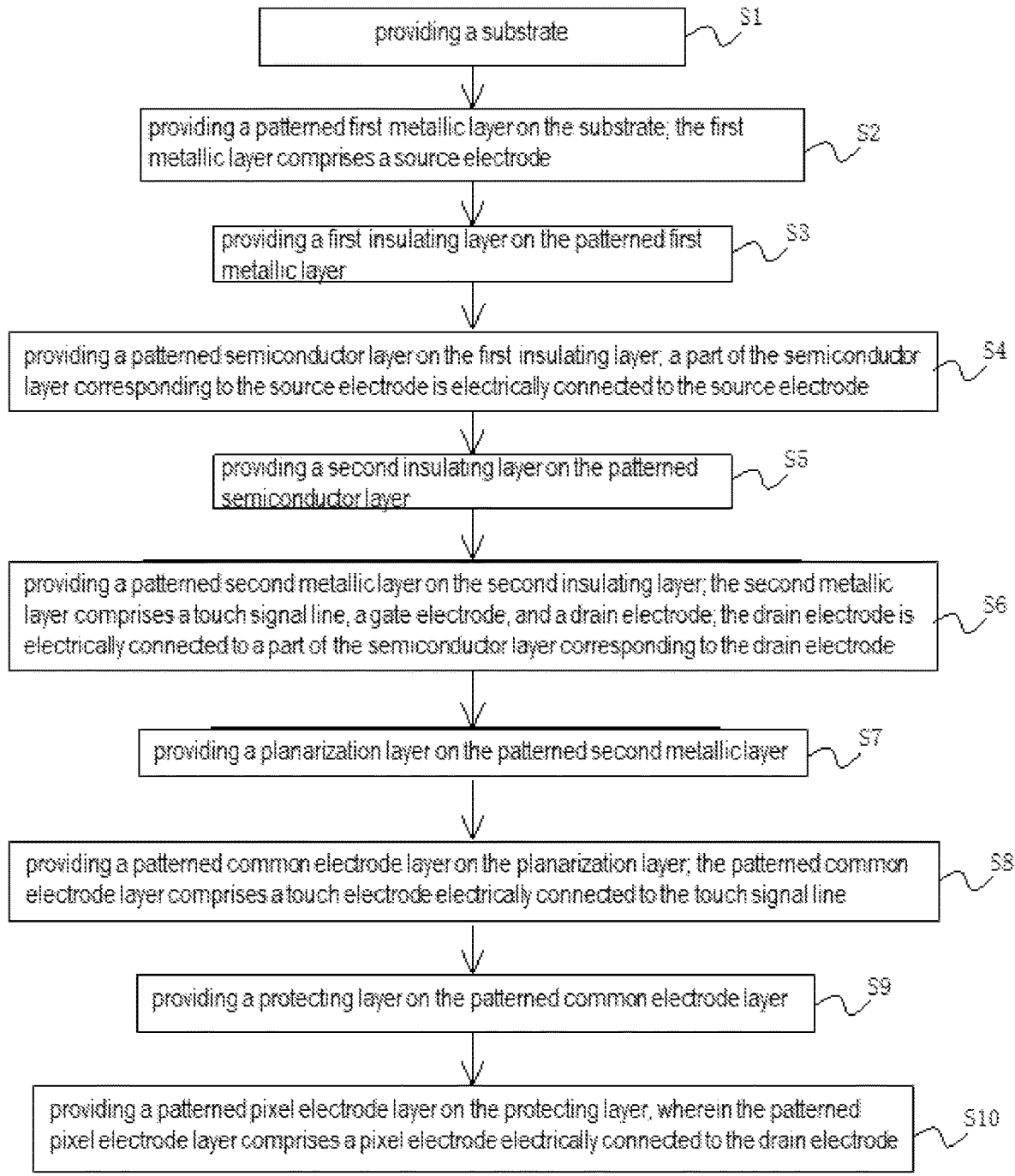
FIG. 1 is a schematic flowchart of a process of a method of manufacturing an array substrate according to an embodiment of the present disclosure.
Figure 2:
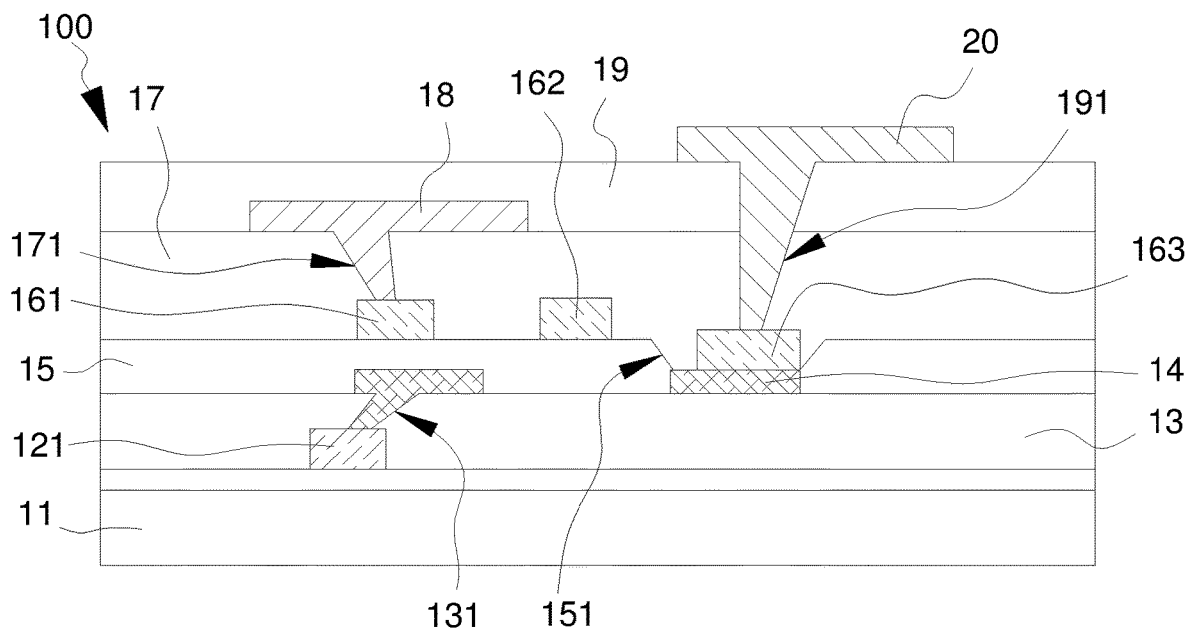
FIG. 2 is a schematic cross-sectional view of a structure of an array substrate prepared by the method of manufacturing the array substrate according to another embodiment of the present disclosure.

Referring to FIG. 1, and FIG. 2. FIG. 1 is a schematic flowchart of a process of a method of manufacturing an array substrate according to an embodiment of the present disclosure. FIG. 2 is a schematic cross-sectional view of a structure of an array substrate prepared by the method of manufacturing the array substrate according to another embodiment of the present disclosure.

one embodiment of the disclosure provides a method of manufacturing an array substrate, including steps of:

step S1: providing a substrate;

step S2: providing a patterned first metallic layer on the substrate, wherein the first metallic layer includes a source electrode;

step S3: providing a first insulating layer on the patterned first metallic layer;

step S4: providing a patterned semiconductor layer on the first insulating layer, wherein a part of the semiconductor layer corresponding to the source electrode is electrically connected to the source electrode;

step S5: providing a second insulating layer on the patterned semiconductor layer;

step S6: providing a patterned second metallic layer on the second insulating layer, wherein the second metallic layer includes a touch signal line, a gate electrode, and a drain electrode, and the drain electrode is electrically connected to a part of the semiconductor layer corresponding to the drain electrode;

step S7: providing a planarization layer on the patterned second metallic layer;

step S8: providing a patterned common electrode layer on the planarization layer, wherein the patterned common electrode layer includes a touch electrode electrically connected to the touch signal line;

step S9: providing a protecting layer on the patterned common electrode layer; and step S10: providing a patterned pixel electrode layer on the protecting layer, wherein the patterned pixel electrode layer includes a pixel electrode electrically connected to the drain electrode;

The following provide a detail description of the method of manufacturing the array substrate 100 of an embodiment of the disclosure.

Step S1: providing a substrate 11. The substrate 11 is a hard substrate such as glass substrate. Then proceed to step S2.

Figure 3:
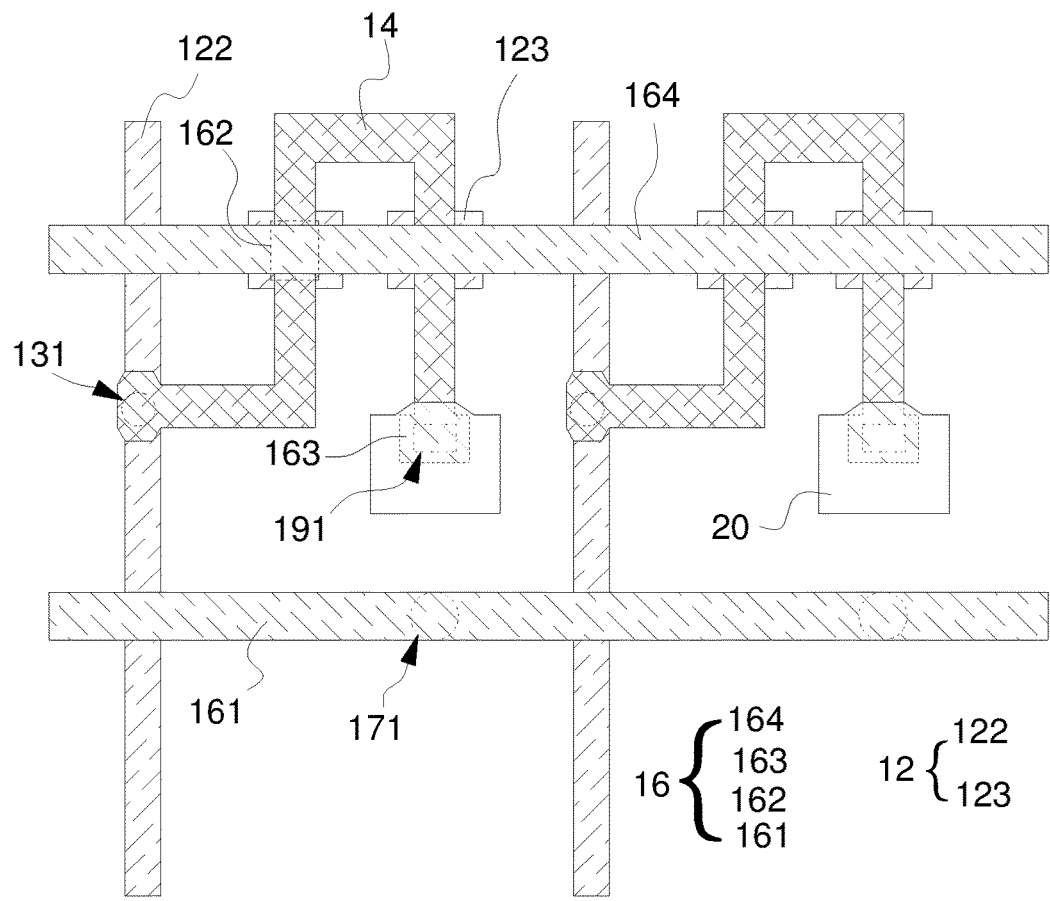
FIG. 3 is a schematic top view of a structure of an array substrate prepared by the method of manufacturing the array substrate according to another embodiment of the present disclosure.

Step S2: providing a patterned first metallic layer 12 on the substrate 11, referring to FIG. 3, wherein the first metallic layer 12 includes a source electrode 121, a data line 122, and a shading layer 123. The data line 122 is connected to the source electrode 121 and integrated to the source electrode 121. The shading layer 123 is disposed under a channel of the semiconductor layer 14 to avoid from irradiating the channel by laser. The data line 122, the source electrode 121, and the shading layer 123 are formed with the same mask to reduce technical processes.

A buffer layer (not shown) is provided on the substrate 11 before the step of providing the first metallic layer 12. Then the first metallic layer 12 is provided on the buffer layer. Then proceed to step S3.

Step S3: providing a first insulating layer 13 on the patterned first metallic layer 12.

In detail, the first insulating layer is provided on the patterned first metallic layer first, then the first insulating layer is patterned to form a first via hole 131 exposing the source electrode 121. Then proceed to step S4.

Step S4: providing a patterned semiconductor layer 14 on the first insulating layer 13, wherein a part of the semiconductor layer 14 corresponding to the source electrode 121 is electrically connected to the source electrode 121.

In detail, a layer of amorphous silicon layer is provided on the first insulating layer 13. The amorphous silicon layer is subjected to laser annealing to from a poly-silicon layer. The poly-silicon layer is subjected to ion doping and shaping to form the semiconductor layer 14. Some material of the semiconductor layer 14 are filled in the first via hole 131 for a part of the semiconductor layer 14 corresponding to the source electrode 121 to be connected to the source electrode 121 through the first via hole 131. Then proceed to step S5.

Step S5: providing a second insulating layer 15 on the patterned semiconductor layer 14. In detail, providing the second insulating layer 15 on the patterned semiconductor layer 14 first, then the semiconductor layer 14 is hydrogenated by hydrogen in the second insulating layer 15 as a hydrogen source. The second insulating layer 15 is then patterned to form an opening 151 exposing a part of the semiconductor layer 14 corresponding to the source electrode.

The second insulating layer 15 is used as the hydrogen source layer of the semiconductor layer 14 because the second insulating layer 15 is closest to the semiconductor layer 14 and facilitates hydrogen ions of the second insulating layer 15 to enter the semiconductor layer 14 during hydrogenation, thereby improving electron mobility of the semiconductor layer 14. Then proceed to step S6.

Step S6: providing a patterned second metallic layer 16 on the second insulating layer 15, wherein the second metallic layer 16 includes a touch signal line 161, a gate electrode 162, a drain electrode 163, and gate line 164. The touch signal line, the gate electrode, the gate line, and the drain electrode are formed with the same mask to reduce technical processes.

Referring to FIG. 2 and FIG. 3, the drain electrode 163 is providing in the opening 151, and electrically connected to a part of the semiconductor layer 14 corresponding to the drain electrode 163. The gate line 164 is connected to the gate electrode 162 and integrated with the gate electrode 162. An extension direction of the gate line 164 is parallel to an extension direction of the touch signal line 161. Then proceed to step S7.

Step S7: providing a planarization layer 17 on the patterned second metallic layer 16. In detail, a planarization layer 17 is providing on the patterned second metallic layer 16 first, then the planarization layer 17 is subjected to patterning to form a second via hole 171 exposing the touch signal line. Then proceed to step S8.

Step S8: providing a patterned common electrode layer 18 on the planarization layer 17, wherein the patterned common electrode layer 18 includes a touch electrode 181 electrically connected to the touch signal line 161 through the second via hole 171. The common electrode layer is transparent metal oxide such as indium tin oxide. Then proceed to step S9.

Step S9: providing a protecting layer 19 on the patterned common electrode layer 18. In detail, a protecting layer 19 is provided on the patterned common electrode layer 18 first, then the protecting layer 19 is subjected to patterning to form a third via hole 191 corresponding to the drain electrode 163, extending to the planarization layer 17, and exposing the drain electrode 163. Then proceed to step S10.

Step S10: providing a patterned pixel electrode layer 20 on the protecting layer 19, wherein the patterned pixel electrode layer 20 includes a pixel electrode electrically connected to the drain electrode 163 through the third via hole 191.

Thus, the method of manufacturing the array substrate 100 of the embodiment of the present application is completed.

The method of manufacturing an array substrate of the disclosure provides the source electrode 121 of the first metallic layer 12 under the semiconductor layer 14, provides the gate electrode 162, the drain electrode 163, and the touch signal line 161 of the second metallic layer 16 above the semiconductor layer 14, and forms a new transistor structure by electrically connected the source electrode 121, the drain electrode 163, and the semiconductor layer 14 to provide a new process. The disclosure provides the gate electrode 162, the drain electrode 163, and the touch signal line 161 on the same layer and formed with the same mask to reduce technical processes to solve the technical issue that steps of a method for preparing an integrated touch array substrate in the prior art are cumbersome, resulting in high production cost and long cycle.

Referring to FIG. 2 and FIG. 3, another embodiment of the disclosure provides an array substrate 100, includes: a substrate 11, a first metallic layer 12, a first insulating layer 13, a semiconductor layer 14, a second insulating layer 15, a second metallic layer 16, a planarization layer 17, a common electrode layer 18, a protecting layer 19, and a pixel electrode layer 20. A buffer layer (not shown) may be provided between the first metallic layer 12 and the substrate 11.

The first metallic layer 12 is disposed on the substrate 11, wherein the first metallic layer 12 includes a source electrode 121, data line 122, and shading layer 123. The data line 122 is connected to the source electrode 121 and integrated with the source electrode 121. The shading layer 123 is disposed under the channel of the semiconductor layer 14.

The first insulating layer 13 is covering the first metallic layer 12, wherein the first insulating layer 13 is provided with a first via hole 131 corresponding to the source electrode 121;

The semiconductor layer 14 disposed on the first insulating layer 13, wherein a part of the semiconductor layer 14 corresponding to the source electrode 121 is electrically connected to the source electrode 121 through the first via hole 131.

The second insulating layer 15 covering the semiconductor layer 14, wherein the second insulating layer 15 is provided with an opening 151 exposing a part of the semiconductor layer 14 corresponding to a drain electrode 121.

The second metallic layer 16 is disposed on the second insulating layer 15, wherein the second metallic layer includes a touch signal line 161, a gate electrode 162, the drain electrode 163, and the gate line 164. the gate line 164 is connected to the gate electrode 162 and integrated to the gate electrode 162. An extension direction of the touch signal line 161 is parallel to an extension direction of the gate line 164. The drain electrode 121 is disposed in the opening 151 and is electrically connected to the semiconductor layer 14.

The planarization layer 17 is covering the second metallic layer 16. The planarization layer 16 is provided with a second via hole 171 exposing the touch signal line 161.

The common electrode layer 18 disposed on the planarization layer 17, wherein the common electrode layer 18 includes a touch electrode 181 electrically connected to the touch signal line 161 through the second via hole 171.

The protecting layer 19 is covering the common electrode layer 18, wherein the protecting layer 19 is provided with a third via hole 191 corresponding to the drain electrode 163, extending to the planarization layer 17, and exposing the drain electrode 163.

The pixel electrode layer 20 is disposed on the protecting layer 19, wherein the pixel electrode layer 20 includes a pixel electrode electrically connected to the drain electrode 163 through the third via hole 191.

In comparison with prior art, the method of manufacturing an array substrate of the disclosure provides the source electrode of the first metallic layer under the semiconductor layer, provides the gate electrode, the drain electrode, and the touch signal line of the second metallic layer above the semiconductor layer, and forms a new transistor structure by electrically connected the source electrode, the drain electrode and the semiconductor layer to provide a new process. The disclosure provides the gate electrode, the drain electrode, and the touch signal line on the same layer and formed with the same mask to reduce technical processes to solve the technical issue that steps of a method for preparing an integrated touch array substrate in the prior art are cumbersome, resulting in high production cost and long cycle. The present disclosure of a display panel, a method of manufacturing the same and a terminal has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:
1. A method of manufacturing an array substrate, comprising:
    providing a substrate;
    providing a patterned first metallic layer on the substrate, wherein the first metallic layer comprises a source electrode;
    providing a first insulating layer on the patterned first metallic layer;
    providing a patterned semiconductor layer on the first insulating layer, wherein a part of the semiconductor layer corresponding to the source electrode is electrically connected to the source electrode;

providing a second insulating layer on the patterned semiconductor layer;

providing a patterned second metallic layer on the second insulating layer, wherein the second metallic layer comprises a touch signal line, a gate electrode, and a drain electrode, and the drain electrode is electrically connected to a part of the semiconductor layer corresponding to the drain electrode;

providing a planarization layer on the patterned second metallic layer;

providing a patterned common electrode layer on the planarization layer, wherein the patterned common electrode layer comprises a touch electrode electrically connected to the touch signal line;

providing a protecting layer on the patterned common electrode layer; and providing a patterned pixel electrode layer on the protecting layer, wherein the patterned pixel electrode layer comprises a pixel electrode electrically connected to the drain electrode;

wherein the first metallic layer comprises a data line and a shading layer, and the data line is connected to the source electrode and integrated with the source electrode;

wherein the data line, the source electrode, and the shading layer are formed with a same mask;

wherein the second metallic layer further comprises a gate line connected to the gate electrode and integrated with the gate electrode, and an extension direction of the gate line is parallel to an extension direction of the touch signal line; and wherein the touch signal line, the gate electrode, the gate line, and the drain electrode are formed with a same mask.

2. The method of manufacturing the array substrate according to claim 1, wherein the step of providing the second insulating layer on the patterned semiconductor layer, comprises steps of:

providing the second insulating layer on the patterned semiconductor layer; and patterning the second insulating layer to form an opening exposing the part of the semiconductor layer corresponding to the drain electrode.

3. The method of manufacturing the array substrate according to claim 2, wherein the drain electrode is disposed in the opening and electrically connected to the semiconductor layer.

4. The method of manufacturing the array substrate according to claim 1, wherein the step of providing the first insulating layer on the patterned first metallic layer, comprises steps of:

providing the first insulating layer on the patterned first metallic layer; and patterning the first insulating layer to form a first via hole exposing the source electrode.

5. The method of manufacturing the array substrate according to claim 4, wherein the part of the semiconductor layer corresponding to the source electrode is electrically connected to the source electrode through the first via hole.

6. A method of manufacturing an array substrate, comprises steps of:

providing a substrate;

providing a patterned first metallic layer on the substrate, wherein the first metallic layer comprises a source electrode;

providing a first insulating layer on the patterned first metallic layer;

providing a patterned semiconductor layer on the first insulating layer, wherein a part of the semiconductor layer corresponding to the source electrode is electrically connected to the source electrode;

providing a second insulating layer on the patterned semiconductor layer;

providing a patterned second metallic layer on the second insulating layer, wherein the second metallic layer comprises a touch signal line, a gate electrode, and a drain electrode, and the drain electrode is electrically connected to a part of the semiconductor layer corresponding to the drain electrode;

providing a planarization layer on the patterned second metallic layer;

providing a patterned common electrode layer on the planarization layer, wherein the patterned common electrode layer comprises a touch electrode electrically connected to the touch signal line;

providing a protecting layer on the patterned common electrode layer; and providing a patterned pixel electrode layer on the protecting layer, wherein the patterned pixel electrode layer comprises a pixel electrode electrically connected to the drain electrode;

wherein the first metallic layer comprises a data line and a shading layer, and the data line is connected to the source electrode and integrated with the source electrode; and the data line, the source electrode, and the shading layer are formed with a same mask.

7. The method of manufacturing an array substrate according to claim 6, wherein the second metallic layer further comprises a gate line connected to the gate electrode and integrated with the gate electrode, and an extension direction of the gate line is parallel to an extension direction of the touch signal line; and the touch signal line, the gate electrode, the gate line, and the drain electrode are formed with a same mask.

8. The method of manufacturing an array substrate according to claim 6, wherein the step of providing the second insulating layer on the patterned semiconductor layer, comprises steps of:

providing the second insulating layer on the patterned semiconductor layer; and patterning the second insulating layer to form an opening exposing the part of the semiconductor layer corresponding to the drain electrode.

9. The method of manufacturing an array substrate according to claim 8, wherein the drain electrode is disposed in the opening and electrically connected to the semiconductor layer.

10. The method of manufacturing an array substrate according to claim 6, wherein the step of providing the first insulating layer on the patterned first metallic layer, comprises steps of:

providing the first insulating layer on the patterned first metallic layer; and patterning the first insulating layer to form a first via hole exposing the source electrode.

11. The method of manufacturing an array substrate according to claim 10, wherein the part of the semiconductor layer corresponding to the source electrode is electrically connected to the source electrode through the first via hole.

12. An array substrate, comprises:

a substrate;

a patterned first metallic layer disposed on the substrate, wherein the first metallic layer comprises a source electrode;

a first insulating layer covering the first metallic layer, wherein the first insulating layer is provided with a first via hole corresponding to the source electrode;

a semiconductor layer disposed on the first insulating layer, wherein a part of the semiconductor layer corresponding to the source electrode is electrically connected to the source electrode through the first via hole;

a second insulating layer covering the semiconductor layer, wherein the second insulating layer is provided with an opening exposing a part of the semiconductor layer corresponding to a drain electrode;

a second metallic layer disposed on the second insulating layer, wherein the second metallic layer comprises a touch signal line, a gate electrode, and the drain electrode, and the drain electrode is disposed in the opening and is electrically connected to the semiconductor layer;

a planarization layer covering the second metallic layer, the planarization layer is provided with a second via hole exposing the touch signal line;

a common electrode layer disposed on the planarization layer, wherein the common electrode layer comprises a touch electrode electrically connected to the touch signal line through the second via hole;

a protecting layer covering the common electrode layer, wherein the protecting layer is provided with a third via hole corresponding to the drain electrode, extending to the planarization layer, and exposing the drain electrode; and a pixel electrode layer disposed on the protecting layer, wherein the pixel electrode layer comprises a pixel electrode electrically connected to the drain electrode through the third via hole;

wherein the second metallic layer further comprises a gate line connected to the gate electrode and integrated with the gate electrode, and an extension direction of touch signal line is parallel to an extension direction of the gate line.

13. The array substrate according to claim 12, wherein the first metallic layer comprises a data line and a shading layer, the data line is connected to the source electrode and integrated with the source electrode, and the shading layer is disposed under a channel of the semiconductor layer.

* * * * *